US011967362B2

(12) United States Patent
Vo et al.

(10) Patent No.: US 11,967,362 B2

(45) Date of Patent: Apr. 23, 2024

(54) PRE-SENSE GUT NODE AMPLIFICATION IN SENSE AMPLIFIER

(71) Applicant: Micron Technology, Inc., Boise, ID (US)

(72) Inventors: Huy T. Vo, Boise, ID (US); Christopher K. Morzano, Boise, ID (US); Christopher J. Kawamura, Boise, ID (US); Charles L. Ingalls, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 176 days.

(21) Appl. No.: 17/829,737

(22) Filed: Jun. 1, 2022

(65) Prior Publication Data

US 2023/0395130 A1 Dec. 7, 2023

(51) Int. Cl.
*G11C 16/04* (2006.01)
*G11C 11/4091* (2006.01)

(52) U.S. Cl.
CPC ................................ *G11C 11/4091* (2013.01)

(58) Field of Classification Search
CPC .................................................. G11C 11/4091
See application file for complete search history.

(56) References Cited

U.S. PATENT DOCUMENTS 6,301,175 B1 * 10/2001 Seyyedy ............. G11C 11/4091 365/207
10,482,931 B1 11/2019 Miyatake
11,676,649 B2 * 6/2023 Kitagawa ............ G11C 11/2257 365/207
2023/0084668 A1 * 3/2023 Kim .................... G11C 11/4091 365/205

* cited by examiner

*Primary Examiner* — Pho M Luu
(74) *Attorney, Agent, or Firm* — Fletcher Yoder, P.C.

(57) ABSTRACT

A memory device includes multiple memory cells configured to store data. The memory device also includes multiple digit lines each configured to carry data to and from a respective memory cell. The memory device further includes multiple sense amplifiers each selectively coupled to respective digit lines and including first and second NMOS transistors and first and second gut nodes coupled to the first and second NMOS transistors, respectively. Each sense amplifier is configured to perform threshold compensation for the first and second NMOS transistors by storing respective voltages at the first and second gut nodes that are proportional to the respective threshold voltages of the first and second NMOS transistors. The sense amplifier also amplifies a differential voltage between the first and second gut nodes by charging the first gut node and discharging the second gut node based at least in part on respective charges of the digit lines.

21 Claims, 10 Drawing Sheets

PRE-SENSE GUT NODE AMPLIFICATION IN SENSE AMPLIFIER

BACKGROUND

Field of the Present Disclosure

Embodiments of the present disclosure relate generally to memory devices. More specifically, embodiments of the present disclosure relate to monitoring operation of a memory device.

Description of Related Art

Generally, a computing system may include electronic devices that, in operation, communicate information via electrical signals. For example, a computing system may include a processor communicatively coupled to a memory device, such as a dynamic random-access memory (DRAM) device, a ferroelectric random-access memory (FeRAM) device, another random-access memory (RAM) device, and/or a hybrid device that incorporates more than one type of RAM. In this manner, the processor may communicate with the memory device, for example, to retrieve executable instructions, retrieve data to be processed, by the processor, and/or store data output from the processor.

The memory devices utilize sense amplifiers used by the memory device during read operations. Specifically, the read circuitry of the memory device utilizes the sense amplifiers to receive low voltage (e.g., low differential) signals and amplify the small voltage differences to enable the memory device to interpret the data properly. However, some embodiments of the sense amplifiers consume excess resources (e.g., power and/or area). Furthermore, some sense amplifiers may insufficiently amplify or amplify the low voltages too slowly.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously discussed, the read circuitry of the memory device utilizes the sense amplifiers to receive low voltage (e.g., low differential) signals and amplify the small voltage differences to enable the memory device to interpret the data properly. However, some embodiments of the sense amplifiers consume excess resources (e.g., power and/or area). Thus, as taught herein, the sense amplifiers may be modified to use an array voltage (VARY) directly rather than generating a local voltage (ACT). Furthermore, by foregoing the local voltage, the sense amplifiers may operate using a lower voltage. Additionally, removing the circuitry used to generate the local voltage may reduce size, cost, and/or power consumption. Furthermore, some sense amplifiers may insufficiently amplify or amplify the low voltages too slowly. Thus, to increase the amplification in the sense amplifier, the sense amplifier may utilize gut node preamplification to increase accuracy of the read of data from digit lines. Furthermore, by increasing the fidelity using amplification, the length of digit lines may be increased to a distance that is not suitable for use without the differential voltage presense amplification.

Figure 1:
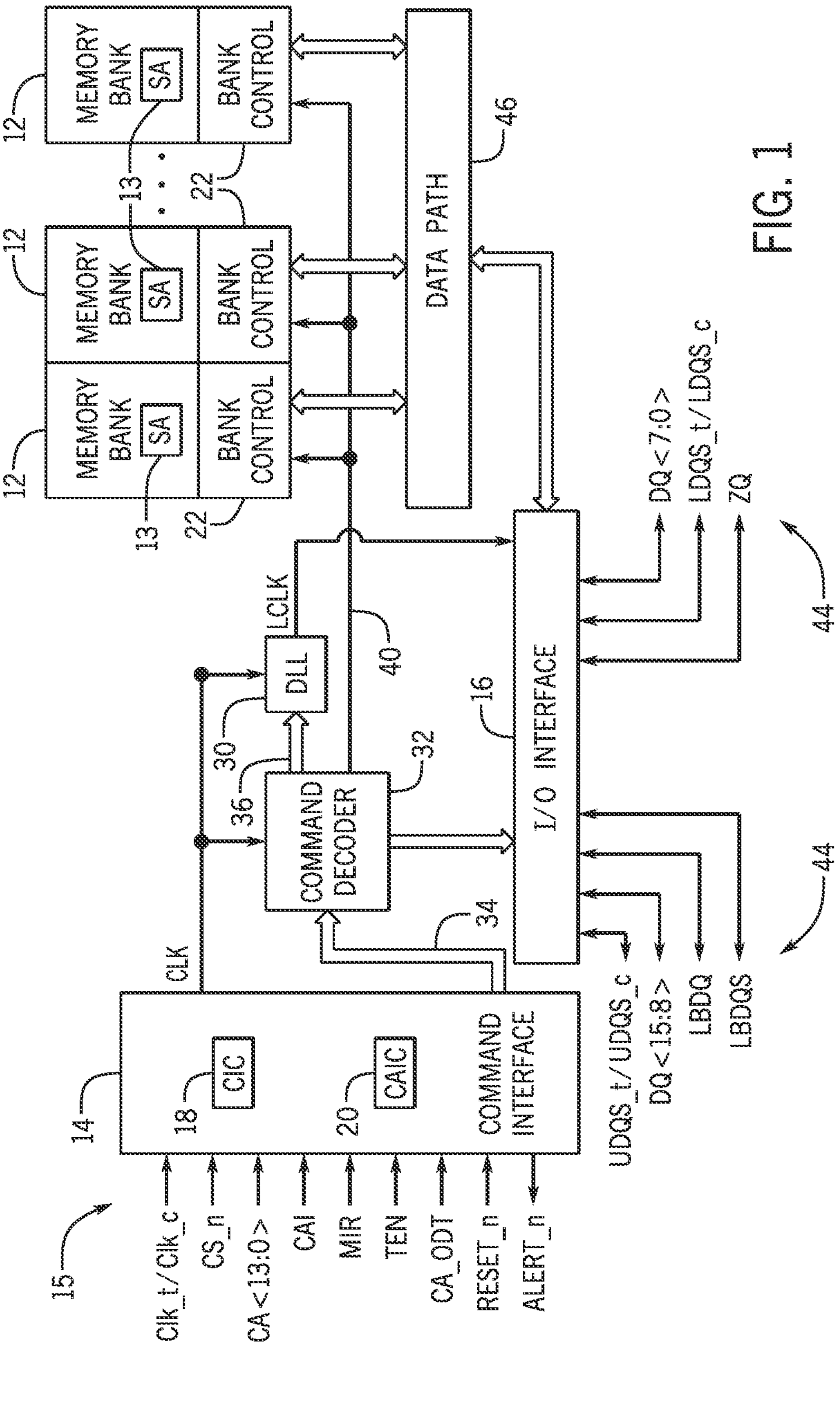
FIG. 1 is a simplified block diagram illustrating certain features of a memory device have sense amplifiers, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory banks 12 and/or bank control blocks 22 include sense amplifiers 13. As previously noted, sense amplifiers 13 are used by the memory device 10 during read operations. Specifically, read circuitry of the memory device 10 utilizes the sense amplifiers 13 to receive low voltage (e.g., low differential) signals from the memory cells of the memory banks 12 and amplifies the small voltage differences to enable the memory device 10 to interpret the data properly.

The memory device 10 may include a command interface 14 and an input/output (I/O) interface 16. The command interface 14 is configured to provide a number of signals (e.g., signals 15) from an external (e.g., host) device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, the true clock signal Clk_t and the bar clock signal Clk_c. The positive clock edge for DDR refers to the point where the rising true clock signal Clk_t crosses the falling bar clock signal Clk_c, while the negative clock edge indicates that transition of the falling true clock signal Clk_t and the rising of the bar clock signal Clk_c. Commands (e.g., read command, write command, etc.) are typically entered on the positive edges of the clock signal and data is transmitted or received on both the positive and negative clock edges.

The clock input circuit 18 receives the true clock signal Clk_t and the bar clock signal Clk_c and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. In some embodiments, the clock input circuit 18 may include circuitry that splits the clock signal into multiple (e.g., 4) phases. The clock input circuit 18 may also include phase detection circuitry to detect which phase receives a first pulse when sets of pulses occur too frequently to enable the clock input circuit 18 to reset between sets of pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes the bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20, which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback data signal (LBDQ) and loopback strobe signal (LBDQS) may be provided to the memory device 10 through the IO interface 16. The loopback data signal and the loopback strobe signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both LBDQ and LBDQS or possibly just a loopback data pin. This is generally intended to be used to monitor the data captured by the memory device 10 at the IO interface 16. LBDQ may be indicative of a target memory device, such as memory device 10, data operation and, thus, may be analyzed to monitor (e.g., debug and/or perform diagnostics on) data operation of the target memory device. Additionally, LBDQS may be indicative of a target memory device, such as memory device 10, strobe operation (e.g., clocking of data operation) and, thus, may be analyzed to monitor (e.g., debug and/or perform diagnostics on) strobe operation of the target memory device.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description. Furthermore, although the foregoing discusses the memory device as being a DDR5 device, the memory device 10 may be any suitable device (e.g., a double data rate type 4 DRAM (DDR4), a ferroelectric RAM device, or a combination of different types of memory devices).

Figure 2:
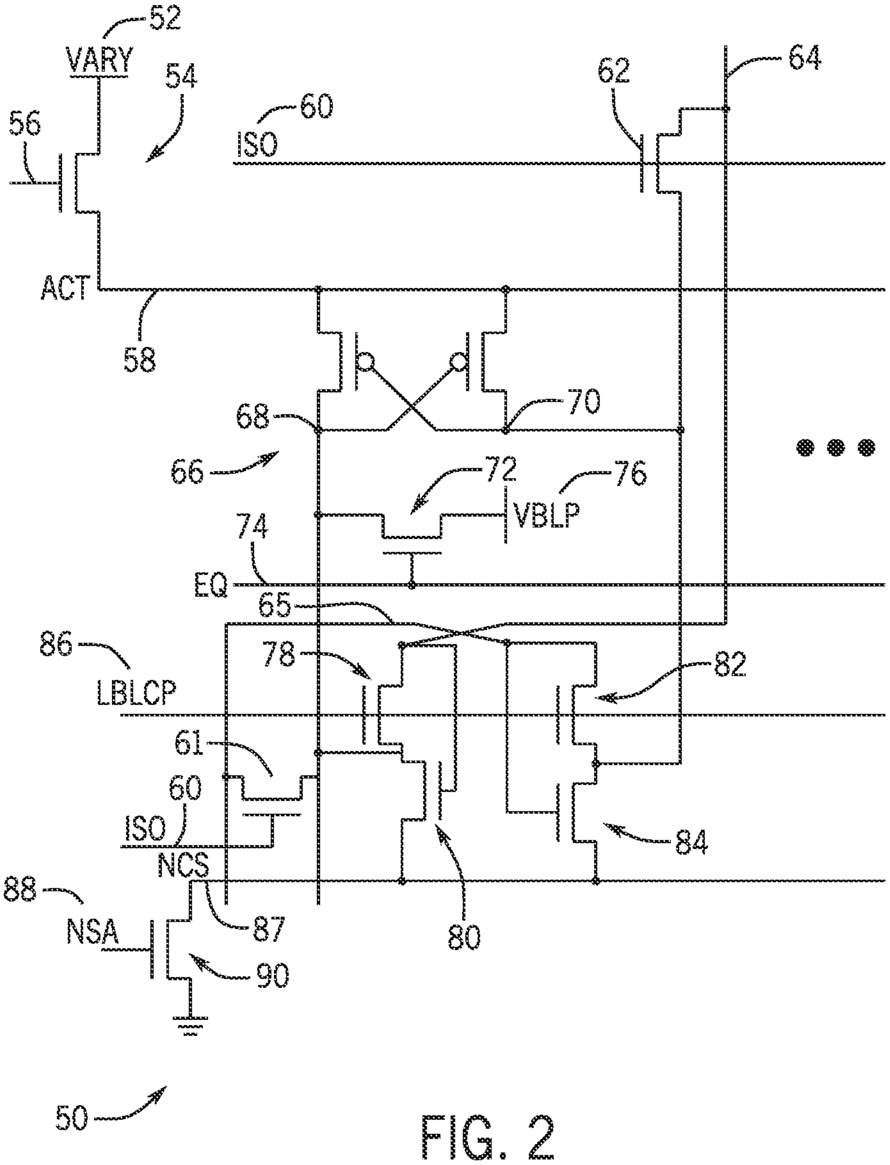
FIG. 2 is a circuit diagram of an embodiment of the sense amplifiers of FIG. 1, according to an embodiment of the present disclosure.

FIG. 2 is a circuit diagram of a sense amplifier 50 that may be implemented as an embodiment of the sense amplifiers 13 of FIG. 1. Although only a single sense amplifier 50 is shown, multiple sense amplifiers 13 are included in the memory device 10 that may share at least some control signals and/or supply voltages.

As illustrated, the sense amplifier 50 receives an array voltage (VARY) 52. The sense amplifier 50 also includes a transistor 54 that receives a control signal 56 at its gate to control generation of an activate signal (ACT) 58 as a local voltage. The ACT 58 activates the sense amplifier 50 by providing an operating voltage to the sense amplifier 50.

The sense amplifier 50 also receives an isolation signal (ISO) 60. The sense amplifier 50 includes transistors 61 and 62 that use the ISO 60 to couple and decouple internal circuitry of the sense amplifier 50 from respective digit lines 65 and 64. The digit line 65 may be indicative of the data in the memory cell as a "bit line true" signal (BLT) while the digit line 64 may be opposite as a complementary "bit line bar/false" signal (BLB).

The sense amplifier 50 also includes a cross-coupled p-channel metal oxide semiconductor device (CCP) 66. Gut nodes 68 and 70 are each coupled to a first terminal (e.g., gate) of a respective one of the P-channel MOSFETs of the CCP 66 and to a second terminal (e.g., drain) of the other respective P-channel MOSFET of the CCP 66.

The sense amplifier 50 further includes a transistor 72 that is used to equalize the voltages of the gut nodes 68 and 70 based on an equalization signal (EQ) 74. Specifically, the gut node 68 may be discharged/charged to a bit line precharge voltage (VBLP) 76 when the EQ 74 is asserted. The ISO 60 controls coupling of the gut node 68 to and decoupling of the gut node 68 from the digit line 65 via the transistor 61. Similarly, the ISO 60 controls coupling of the gut node 70 to and decoupling of the gut node 70 from the digit line 64 via the transistor 62.

The sense amplifier 50 further includes n-channel MOSFETs (NMOS) transistors 78, 80, 82, and 84. The n-channel transistors 78 and 82 both receive a local bit line compensation enable signal (lblcp) 86 at their respective gates. Another terminal (e.g., source) of the NMOS transistor 78 is coupled to the digit line 64 while another terminal (e.g., source) of the NMOS transistor 82 is coupled to the digit line 65. The third terminal of the NMOS transistor 78 is coupled to a terminal (e.g., source) of the NMOS transistor 78, and the third terminal of the NMOS transistor 82 is coupled to a terminal (e.g., source) of the NMOS transistor 84. The gate of the NMOS transistor 80 is coupled to the digit line 64, and the gate of the NMOS transistor 84 is coupled to the digit line 65. The third terminals of the transistors 80 and 84 are coupled to an n-channel strobe (NCS) 87. The sense amplifier 50 receives an n-channel sense amplifier signal (NSA) 88 to control a transistor 90 that selectively couples and decouples the NCS 87 from ground.

The illustrated embodiment of the sense amplifier 50 senses low voltage data and amplifies the low voltage data, but the sense amplifier 50 may have some drawbacks. Specifically, the local generation of the ACT 58 from the VARY 52 may be problematic. Although VARY 52 may be a well-regulated voltage, there may be a voltage drop through the transistor 54 (and any other circuitry) during low voltage operation that may cause the ACT 58 improperly fluctuate. For example, VARY may regulated from VDD and may be as low as 0.8V for LPDRAM during an Activate cycle. This low voltage may correspond to a voltage drop through transistor 54 that could be as high as 0.1V, resulting in ACT level could be as low as 0.7V that may greatly degrade the activate cycle operation. By removing the local generation of the ACT 58, such voltage drops during low voltage operation may be avoided. Furthermore, the limited amount of amplification in the sense amplifier 50 causes the length of the digit lines 64 and 65 to be limited and/or the amount of noise relatively significant.

Figure 3:
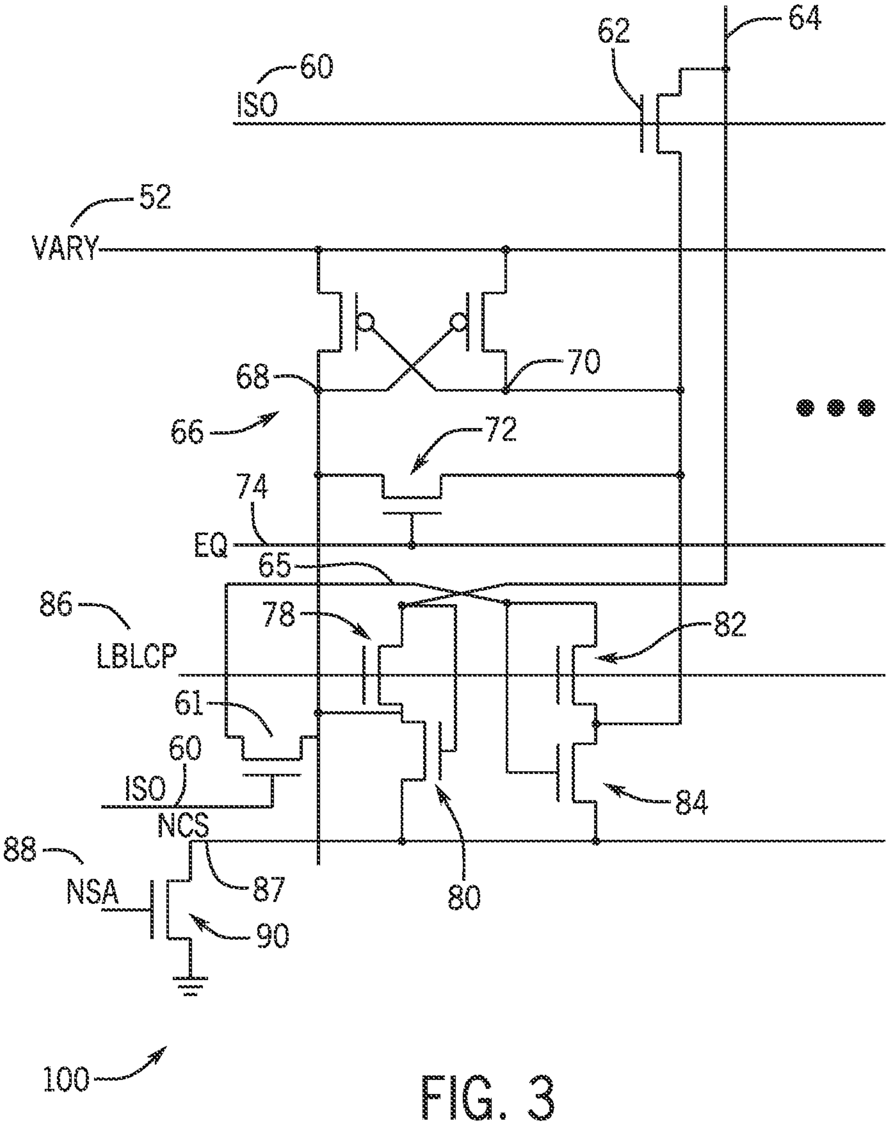
FIG. 3 is a circuit diagram of an alternative embodiment of the sense amplifiers of FIG. 1, according to an embodiment of the present disclosure.

To address the issues with the sense amplifier 50, an alternative embodiment of the sense amplifiers 13 may be used. For instance, FIG. 3 shows a sense amplifier 100 that may be used in place of at least one of the sense amplifiers 50 as the sense amplifiers 13 of the memory device 10. The sense amplifier 100 is similar to the sense amplifier 50 except that the sense amplifier 100 is configured differently in that it does not locally generate ACT 58 and does not connect the gut node 68 to VBLP 76 via the transistor 72.

Instead of locally generating the ACT 58, the sense amplifier 100 utilizes the VARY 52 directly and omits the transistor 54 entirely. This reliance on the VARY 52 directly instead of the ACT 58 via the transistor 54 enables the array to be used at low voltages. This ability enables the memory device 10 to operate with lower power consumption with array and peripheral power supplies scaling and/or to enable a robust design that increases reliability. The usage of VARY 52 further may enhance row active time (tRAS) and/or write recover time (tWR) timing. Furthermore, the removal of the transistor 54 may allow reduced sizing for the sense amplifier 100 when compared to the sense amplifier 50.

Additionally, the different mechanism for utilizing the sense amplifier 100 may further reduce noise on the digit lines 64 and 65. This enables the digit lines to be longer at process nodes with the differential voltage presensing amplification in the sense amplifier 100.

Figure 4:
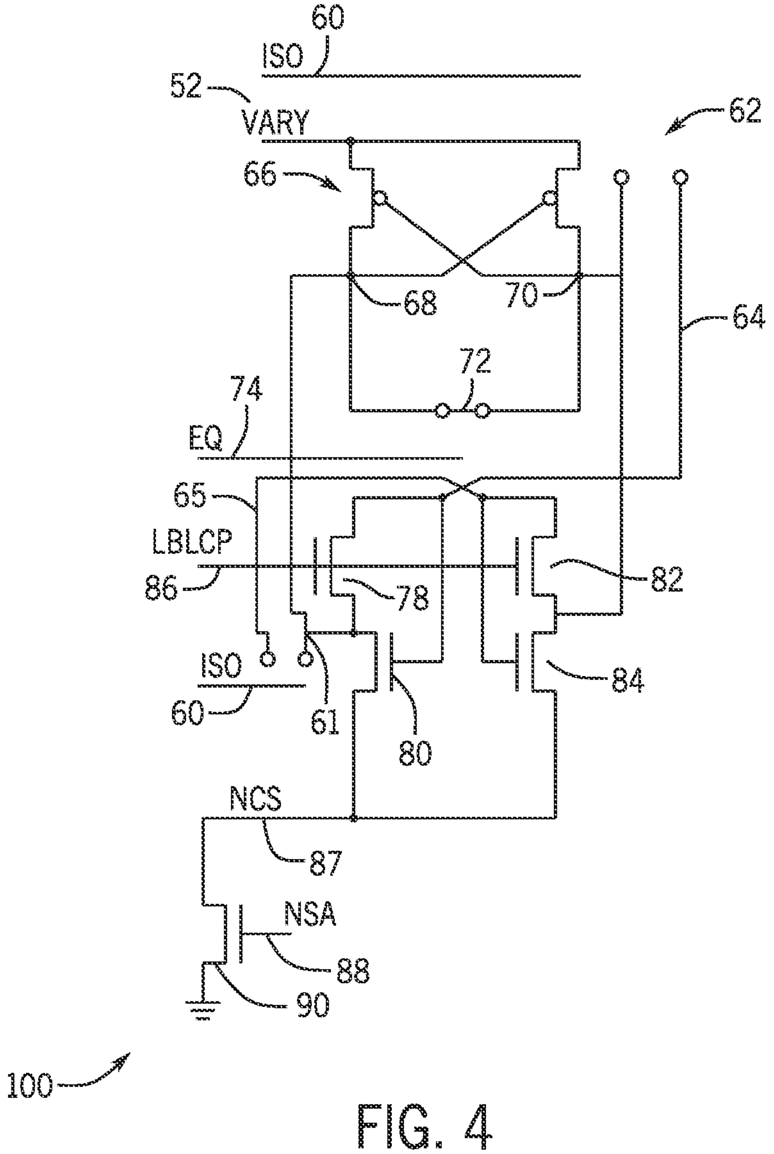
FIG. 4 is a circuit diagram of the embodiment of the sense amplifiers of FIG. 3 in a first stage of sense amplification, according to an embodiment of the present disclosure.

FIG. 4 is a circuit diagram of the sense amplifier 100 in a first stage. This first stage may be during precharge of a previous cycle. As illustrated, the ISO 60 is off/deasserted thereby causing the transistor 62 to act as an open switch disconnecting the digit line 64 and the gut node 70. The off state of the ISO 60 also causes the transistor 61 to act as an open switch to disconnect the digit line 65 from the gut node 68. The EQ 74 is asserted causing the transistor 72 to function as a closed switch connecting the gut nodes 68 and 70 together to cause their voltages to be equalized. The lblcp 86 and the NSA 88 may also be off/deasserted in this stage.

Figure 5:
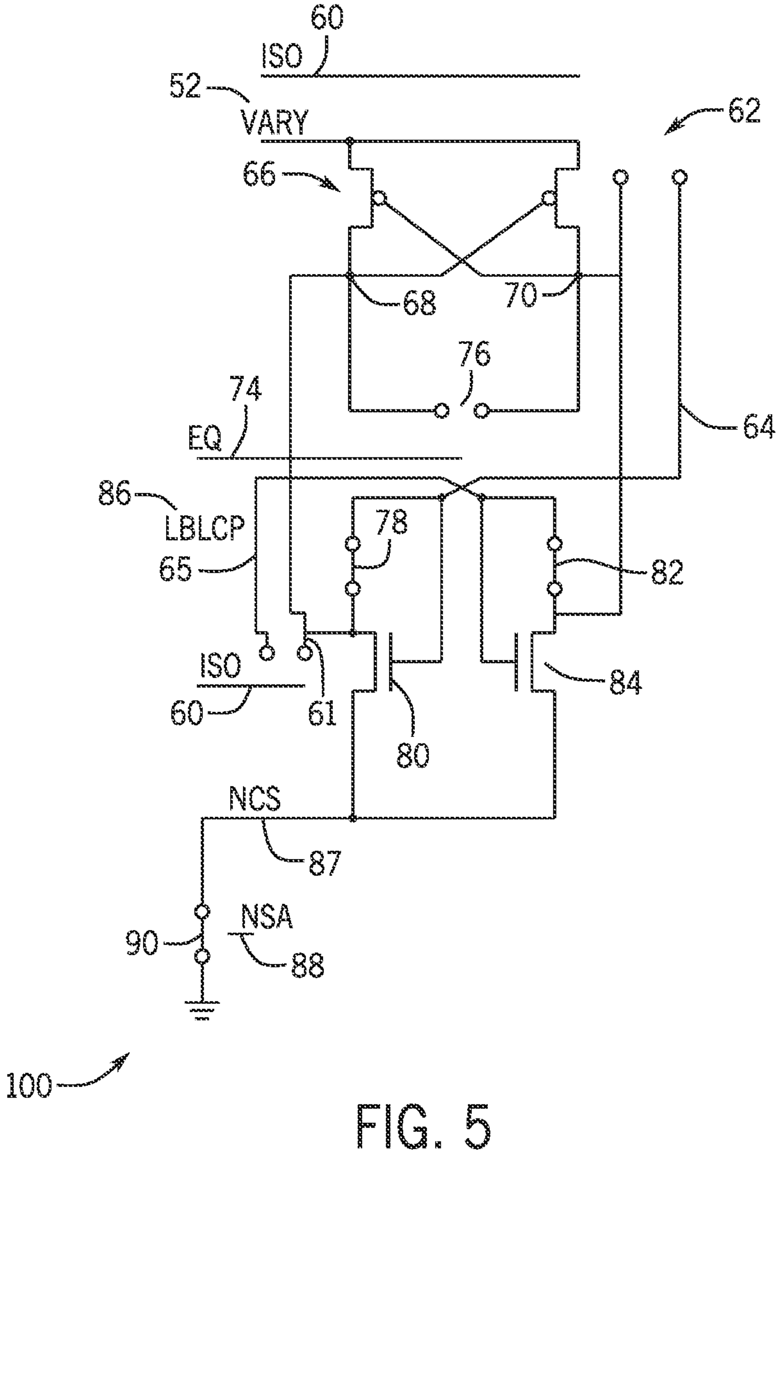
FIG. 5 is a circuit diagram of the embodiment of the sense amplifiers of FIG. 3 in a second stage of sense amplification, according to an embodiment of the present disclosure.

FIG. 5 is a circuit diagram of the sense amplifier 100 in a second stage immediately after the first stage. The second stage may correspond to a low-voltage threshold voltage compensation stage with a gut node equalization. This stage begins with the lblcp 86 being asserted along with the NSA 88. The EQ 74 is also deasserted at the beginning of the second stage to decouple the gut nodes 68 and 70 from each other. The assertion of lblcp 86 causes the gut node 68 to be coupled to two terminals (e.g., gate and source) of the NMOS transistor 80. This connection is made because the assertion of the lblcp 86 causes the NMOS transistor 78 to act as a closed switch between the two terminals of the NMOS transistor 80. Similarly, the assertion of the lblcp 86 causes the gut node 70 to be coupled to two terminals (e.g., gate and source) of the NMOS transistor 84. This connection is made because the assertion of the lblcp 86 causes the NMOS transistor 82 to act as a closed switch between the two terminals of the NMOS transistor 84. Moreover, the connection of the third terminals (e.g., drain) of the NMOS transistors 80 and 84 are made to ground through the transistor 90 acting as a closed switch due to the assertion of the NSA 88. Due to these connections, the transistors 80 and 84 act as diodes to enable threshold voltage compensation using the charge on the gut nodes 68 and 70 from the previous cycle to set the charge at the gut nodes 68 and 70 to the threshold voltages of the respective transistors 80 and 84.

Figure 6:
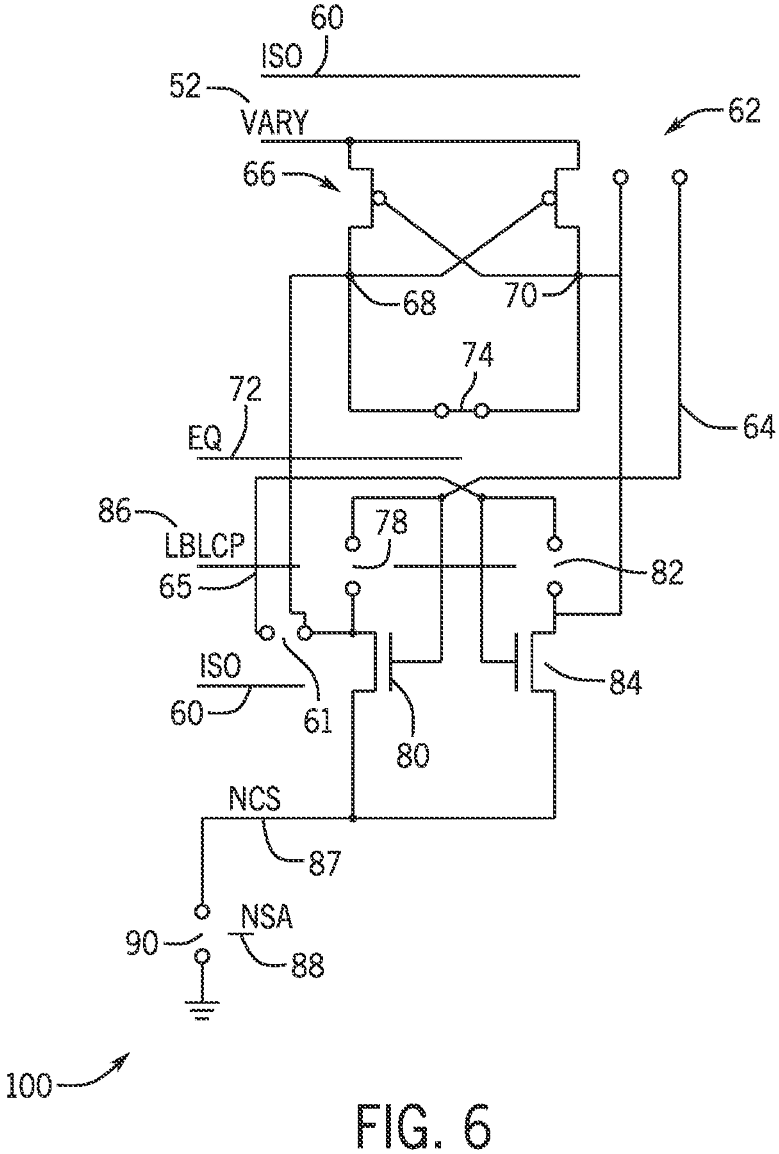
FIG. 6 is a circuit diagram of the embodiment of the sense amplifiers of FIG. 3 in a third stage of sense amplification, according to an embodiment of the present disclosure.

FIG. 6 is a circuit diagram of the sense amplifier 100 in a third stage after the second stage. The third stage corresponds to the high (or low) memory cell being discharged to the respective digit line (e.g., either digit line 64 or digit line 65). This stage includes a deassertion of the lblcp 86 and the NSA 88 causing the transistors 78, 82, and 88 to act as open switches. When the wordline is activated as part of this stage, it causes the high (or low) memory cell to discharge to the corresponding location. For example, the memory cell may charge the corresponding digit line 65. For instance, the discharge of the memory cell may charge the digit line 65 from a median level (e.g., 0.5 V) to a higher level (e.g., 30-50 mV higher) or a lower level (e.g., 30-50 mV lower) than the median level. If the digit line 65 is pulled high, the gut node 70 is pulled low via the NMOS transistor 84. The gut nodes 68 and 70 are also charged. Furthermore, since the EQ 74 is activated at a point in the third stage, the gut nodes 68 and 70 are then charged to similar values that are higher than VBLP, which is beneficial for balancing 1's and 0's margin sensing during the subsequent stages.

Figure 7:
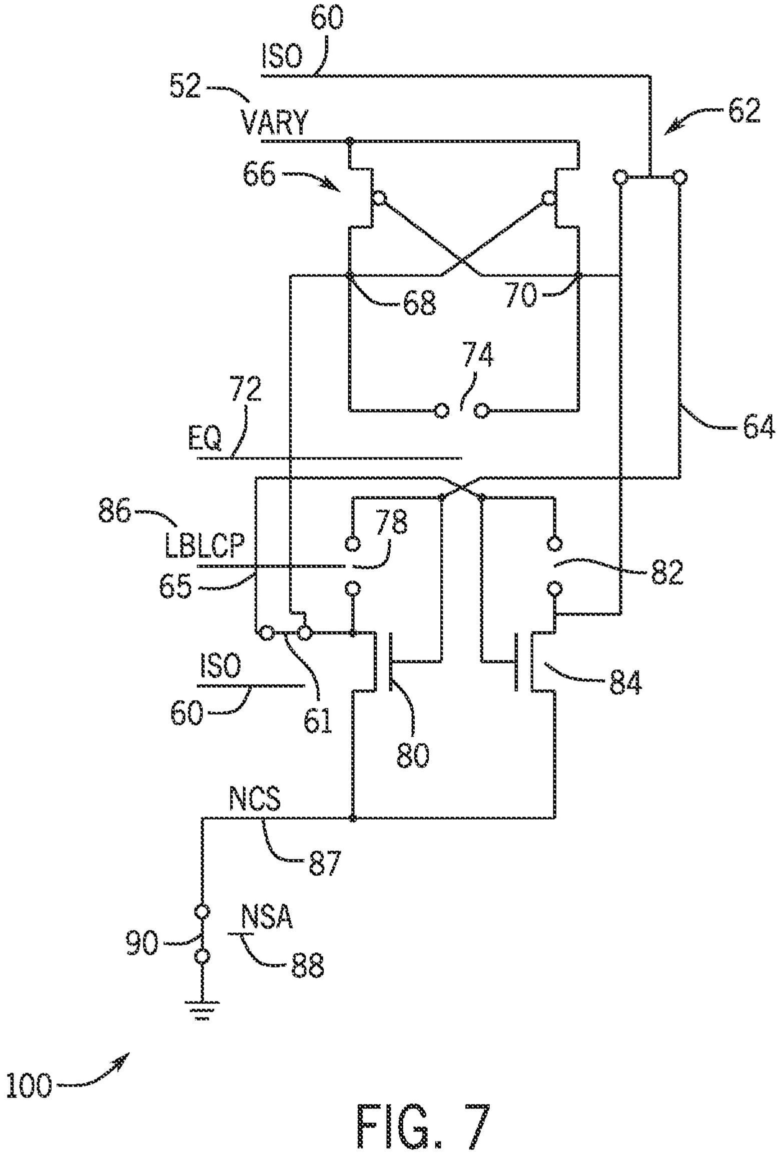
FIG. 7 is a circuit diagram of the embodiment of the sense amplifiers of FIG. 3 in a fourth stage of sense amplification, according to an embodiment of the present disclosure.
Figure 8:
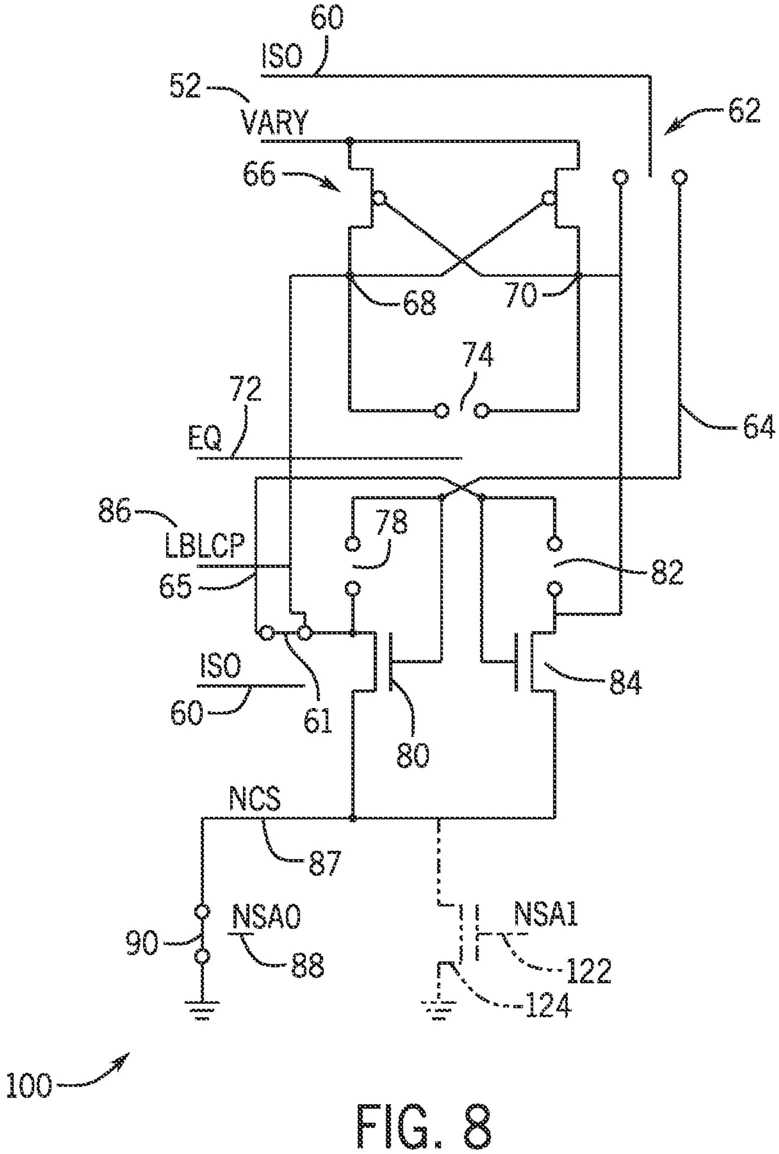
FIG. 8 is a circuit diagram of the embodiment of the sense amplifiers of FIG. 3 in a fifth stage of sense amplification, according to an embodiment of the present disclosure.

FIG. 7 is a circuit diagram of the sense amplifier 100 in a fourth stage after the third stage. The fourth stage causes the sense amplifier 100 to function in a differential voltage amplifier configuration. The EQ 74 is also deasserted during the fourth stage. The fourth stage also corresponds to the NSA 88 being asserted to cause the transistor 90 to act like a closed switch. When the NSA 88 is asserted, the terminals (e.g., drains) of the transistors 80 and 84 are coupled to ground via the transistor 90. Due to the charge in the digit line 65, the NMOS transistor 84 discharges charge from the gut node 70 pulling the voltage of the gut node 70 down while the voltage of the gut node 68 is amplified by opening the transmission through the PMOS between the gut node 68 and the VARY 52. Thus, during the fourth stage, the difference in voltage between the gut nodes 68 and 70 is amplified. By increasing this voltage differential, there is a higher voltage delta between the digit lines 64 and 65 when the data is written to the digit lines 65 and 64 from the gut nodes 68 and 70 when the ISO 60 is reasserted, as shown in the fifth stage shown in FIG. 8.

In some embodiments, the sense amplifier 100 may be used to perform a soft sense where the connection of the transistors 80 and 84 to ground may be performed gradually in steps. This soft sense may be enacted by utilizing different transistors with different control signals to control how strongly and when the transistors 80 and 84 are coupled to ground in the fourth stage. For instance, the transistor 90 may be only a fraction of the size of the total device width and connects the transistors 80 and 84 to ground relatively weakly as a soft strobe in a first part of the sense while another transistor 124 utilizes another NSA 122 to provide additional strobing strength in a second part. Thus, based on the size of the transistors 90 and 124, the first part may provide a first portion (e.g., 50%) of the overall strobe strength while another part (e.g., a sixth stage) provides the rest (e.g., 50%) of the overall strobe strength. However, any number of transistors may be used to provide the strobing strength. In other words, the strobe strength may be staggered into any suitable number (e.g., 1, 2, 3, 4, 5, 6, or more) of sub-parts by utilizing the number of transistors. Furthermore, although these transistors are discussed as generally having the same sizes as each other, some embodiments of the memory device 10 may have at least two of such transistors having difference sizes than each other causing a different ratio between the percentages of overall strobing strength (e.g., 30% in a first part and 70% in a second part).

Figure 9:
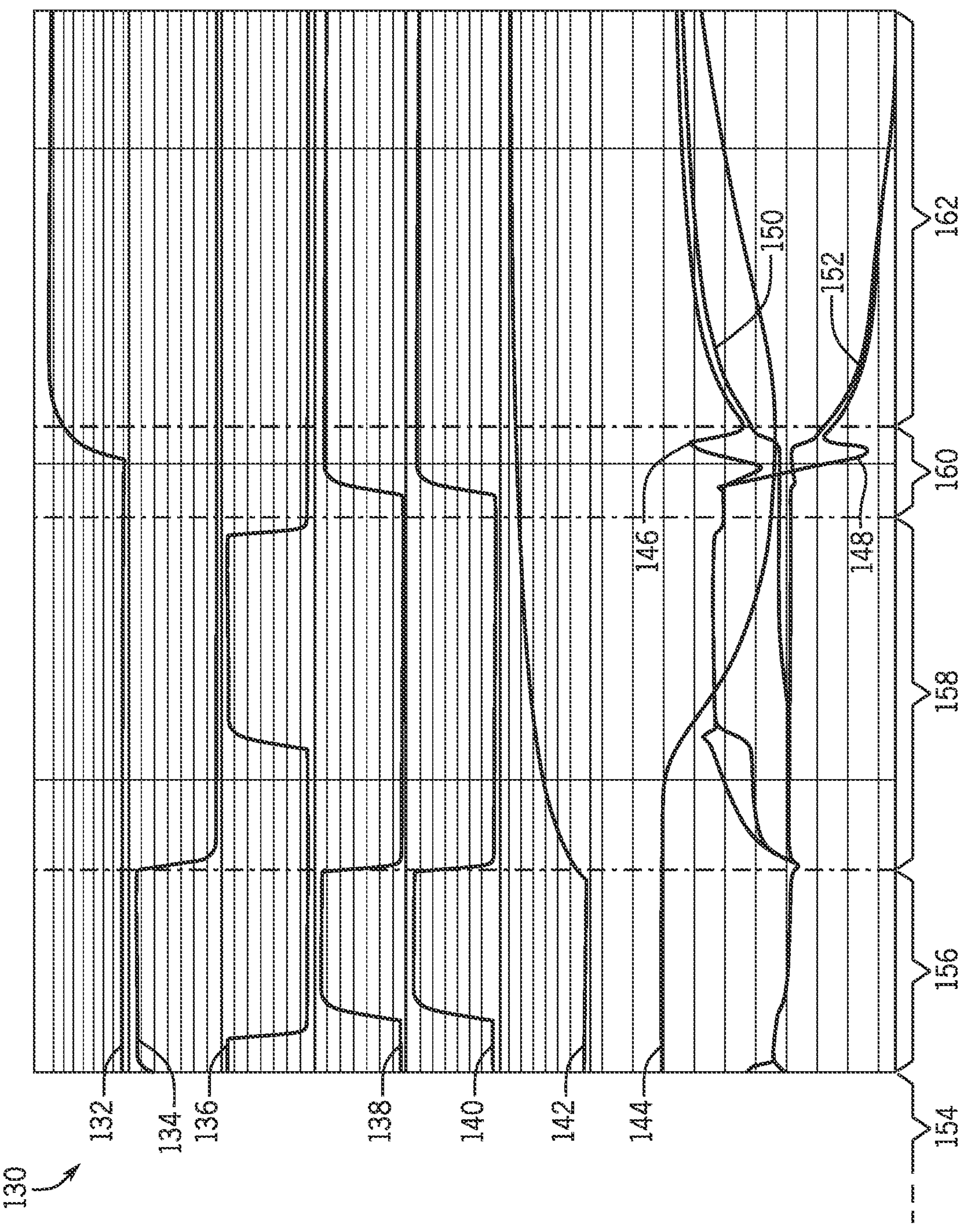
FIG. 9 is a graph of operation of the sense amplifier of FIG. 3 using a single control signal to control an n-channel strobe, according to an embodiment of the present disclosure.

FIG. 9 is a graph 130 showing a timing diagram of the stages of operation of the sense amplifier 100 shown in FIGS. 4-8. As illustrated, the graph 120 includes lines 132, 134, 136, 138, 140, 142, 144, 146, 148, 150, and 152. The line 132 corresponds to the ISO 60. The line 134 corresponds to the lblcp 86. The line 136 corresponds to the EQ 74. The line 138 corresponds to the NSA 88, and the line 140 corresponds to the NSA 122. The line 142 corresponds to the wordline corresponding to the sense amplifier 100. The line 144 corresponds to the high memory cell being read using the sense amplifier 100. The line 146 corresponds to the gut node 68, and the line 148 corresponds to the gut node 70. The line 150 corresponds to the digit line 65, and the line 152 corresponds to the digit line 64.

As previously discussed, the first stage 154 is from a previous cycle with a precharge. As illustrated, in the first stage 154, the ISO 60, the NSA 88, the NSA 122, and the wordline are low while the lblcp 86 and the EQ 74 are both high. In the second stage 156, the EQ 74 remains asserted while the lblcp 86 is deasserted, and the NSA 88 and the NSA 122 are asserted. As previously discussed, this configuration causes sense amplifier 100 to initiate VTC compensation as previously discussed.

In the third stage 158, the lblcp 86, the NSA 88, and the NSA 122 are deasserted while the wordline is asserted. As previously discussed, this configuration causes the digit line 65 to be charged from the high memory cell as a signal development. The gut nodes 68 and 70 are also charged after the assertion of the EQ 74 (line 136) causes the gut nodes 68 and 70 to be equalized.

In the fourth stage 160, the EQ 74 is deasserted, and the NSA 88 and the NSA 122 are both asserted with the CCP 66 and the transistors 78, 80, 82, and 84 in a differential amplifier configuration that causes charge on the gut node 70 (line 148) to be discharged while the charge on the gut node 68 (line 146) is amplified. This increase in difference between the voltages of the gut nodes 68 and 70 increases the fidelity of interpretation of the data from the memory cells.

At the end/in the fourth stage 160, the ISO 60 is reasserted coupling the gut node 68 to the digit line 65 and the gut node 70 to the digit line 64. The NSA 88 and the NSA 122 are also asserted to configure the sense amplifier 100 as a latch to latch in the values for the fifth stage 162.

Figure 10:
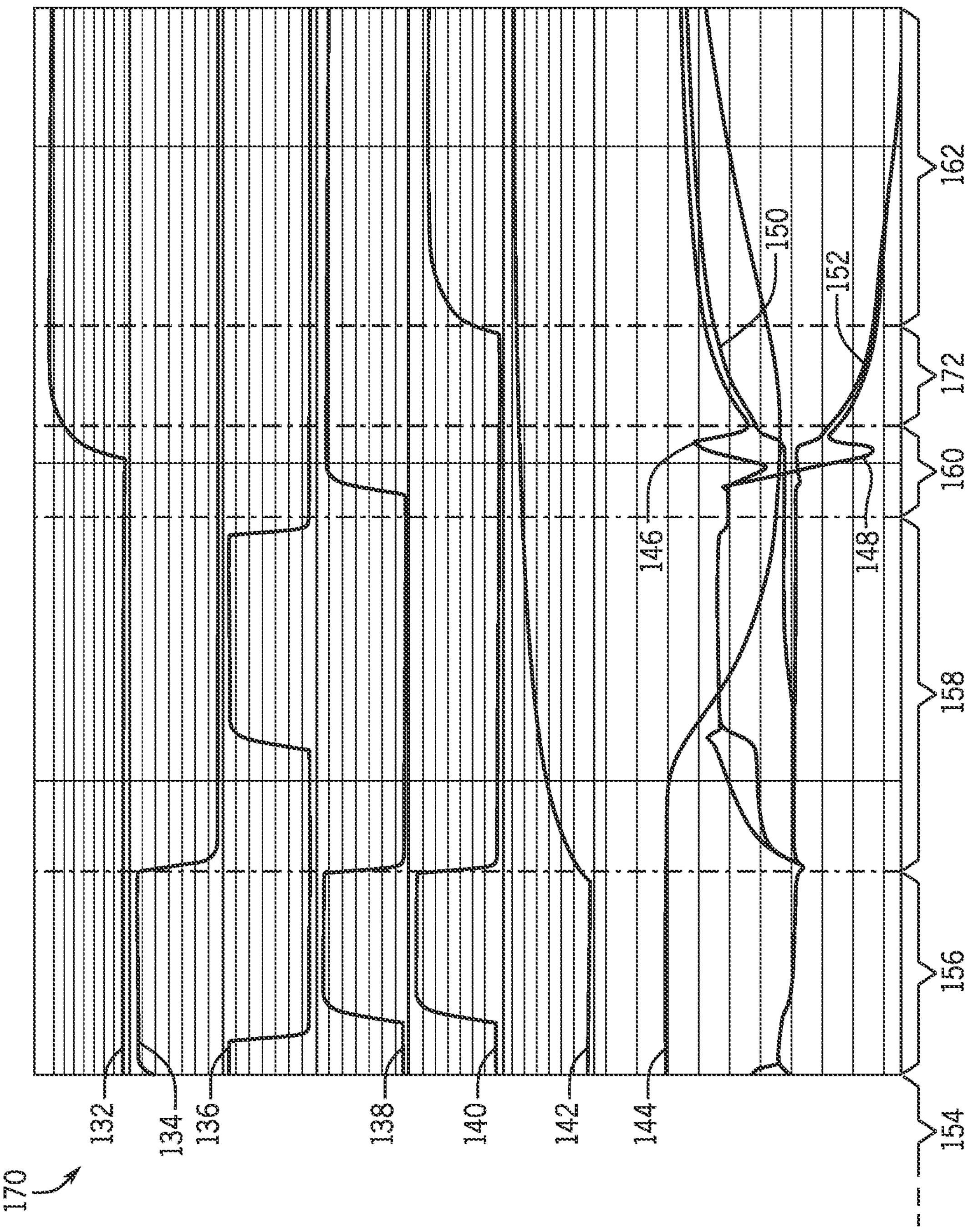
FIG. 10 is a graph of operation of the sense amplifier of FIG. 3 using multiple control signals to control n-channel strobing, according to an embodiment of the present disclosure.

As previously noted, in some embodiments, the NSA 88 and the NSA 122 may be asserted at different times in the fourth stage 160. For instance, FIG. 10 shows a graph 170 that is the same as the graph 130 except that the graph 170 has a period 172 between the assertion of the NSA 88 and the NSA 122 to perform a soft sense.

Returning to FIG. 9, the fifth stage 162 is used to transmit the differential data stored in the gut nodes 68 and 70 to respective digit lines 65 and 64. This transmission is based at least in part on the ISO 60 being asserted.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A memory device, comprising:

a plurality of memory cells configured to store data;

a plurality of digit lines each configured to carry data to and from a respective memory cell of the plurality of memory cells; and a plurality of sense amplifiers each selectively coupled to respective digit lines of the plurality of digit lines and comprising first and second NMOS transistors and first and second gut nodes that are respectively coupled to the first and second NMOS transistors, wherein each sense amplifier is configured to:

charge a first voltage on the first gut node that at least partially compensates for threshold voltage fluctuations of the first NMOS transistor due to process, voltage, or temperature fluctuations and is proportional to the threshold voltage of the first NMOS transistor;

charge a second voltage on the second gut node that at least partially compensates for threshold voltage fluctuations of the second NMOS transistor due to process, voltage, or temperature fluctuations and is proportional to the threshold voltage of the second NMOS transistor;

amplify a differential voltage between the first and second gut nodes by charging the first gut node and discharging the second gut node based at least in part on respective charges from the plurality of digit lines; and send the amplified differential voltage to respective digit lines of the plurality of digit lines as a differential signal.

2. The memory device of claim 1, wherein the plurality of digit lines comprise a plurality of complementary pairs of the digit lines of the plurality of digit lines.

3. The memory device of claim 2, wherein each digit line of each of the plurality of complementary pairs of the digit lines is coupled to respective memory cells storing complementary data.

4. The memory device of claim 1, wherein the sense amplifier comprises a first digit line of the plurality of digit lines that corresponds to the first gut node and a second digit line of the plurality of digit lines corresponds to the second gut node.

5. The memory device of claim 4, wherein the sense amplifier comprises an equalization transistor configured to equalize the first and second gut node before amplifying the differential voltage.

6. The memory device of claim 5, wherein equalization of the first and second gut nodes comprises receiving a logic voltage from a respective memory cell of the plurality of memory cells to charge the first digit line that causes the second gut node to be discharged, wherein the discharge of the second gut node causes the first gut node to be charged using a supply voltage, wherein the equalization via the equalization transistor is performed after the first gut node is charged.

7. The memory device of claim 6, wherein the sense amplifier comprises cross-coupled PMOS transistors, and wherein the charging of first gut node uses the discharging of the second gut node via the cross-coupled PMOS transistors to charge the first gut node.

8. The memory device of claim 7, where the charging of the first gut node in the differential amplification is performed via the cross-coupled PMOS transistors with the equalizing transistor decoupling the first and second gut nodes and the second NMOS transistor discharging of the second gut node.

9. The memory device of claim 1, wherein the memory device is operating in low-voltage operation during the charging of the first voltage, charging of the second voltage, amplification of the differential voltage, and sending the amplified differential voltage to the respective digit lines.

10. The memory device of claim 1, wherein the first and second NMOS transistors are coupled to a plurality of transistors between the first and second NMOS transistors and ground.

11. The memory device of claim 10, wherein at least two of the plurality of transistors are toggled at different times.

12. A memory device, comprising:

one or more memory cells configured to store data;

a pair of digit lines coupled to the one or more memory cells; and a sense amplifier coupled to the pair of digit lines and comprising:

cross-coupled transistors coupled to a supply voltage;

a first gut node coupled to a first transistor of the cross-coupled transistors, wherein the first gut node corresponds to a first digit line of the pair of digit lines;

a second gut node coupled to a second transistor of the cross-coupled transistors, wherein the second gut node corresponds to a second digit line of the pair of digit lines;

a third transistor coupled to the first gut node, wherein a gate of the third transistor is coupled to the second digit line;

a fourth transistor coupled to the second gut node, where a gate of the fourth transistor is coupled to the first digit line;

a first isolating transistor coupled between the first digit line and the first gut node to selectively decouple the first digit line from the first gut node when amplifying a difference in voltages between the first and second gut nodes; and a second isolating transistor coupled between the second digit line and the second gut node to selectively decouple the second digit line from the second gut node when amplifying the difference in voltages between the first and second gut nodes.

13. The memory device of claim 12, wherein the first and second transistors comprise PMOS transistors.

14. The memory device of claim 12, wherein the first digit line is configured to be charged using a logic high value stored in a cell of the one or more memory cells.

15. The memory device of claim 14, wherein the fourth transistor is configured to use the charge of the first digit line to discharge a voltage stored in the second gut node.

16. The memory device of claim 15, wherein the first transistor is configured to use the discharged voltage of the second gut node to amplify the voltage of first gut node to amplify a differential voltage between the first and second gut nodes.

17. The memory device of claim 12, wherein the sense amplifier comprises:

a first compensation transistor coupled between the gate of the third transistor and a source of the third transistor to charge the first gut node with a first voltage proportional to a threshold voltage of the third transistor during a threshold voltage compensation phase; and a second compensation transistor coupled between the gate of the fourth transistor and a source of the fourth transistor to charge the second gut node with a second voltage proportional to a threshold voltage of the fourth transistor during the threshold voltage compensation phase.

18. A method comprising:

configuring a first transistor of a sense amplifier for a memory device in a first diode configuration using a first compensation transistor to couple gate and source terminals of the first transistor together to charge a first gut node with a first voltage proportional to a first threshold voltage of the first transistor;

configuring a second transistor of the sense amplifier in a second diode configuration using a second compensation transistor to couple gate and source terminals of the second transistor together to charge a second gut node with a second voltage proportional to a second threshold voltage of the second transistor;

disconnecting the gate terminal from the source terminal of the first transistor using the first compensation transistor;

disconnecting the gate terminal from the source terminal of the second transistor using the second compensation transistor;

using the sense amplifier, amplifying a difference in voltages between the first and second gut nodes by:

charging a first digit line with a logic high value from a memory cell, wherein the first digit line is configured to send and receive data to and from the sense amplifier via the first gut node;

discharging the second gut node using the charging of the first digit line; and charging the first gut node using the discharging of the second gut node; and transmitting the amplified difference in voltages between the first and second gut nodes as a differential signal over the digit lines.

19. The method of claim 18, wherein configuring the first transistor in the first diode configuration, configuring the second transistor in the second diode configuration, disconnecting the gate terminal from the source terminal of the first transistor, and disconnecting the gate terminal from the source terminal of the first second transistor are performed using a control signal to control the first and second compensation transistors in tandem.

20. The method of claim 18, wherein charging the first gut node using the discharging of the second gut node is performed by a connection of the second gut node to a gate terminal of a PMOS transistor, and two other terminals of the PMOS transistor are coupled to a voltage supply and to the first gut node, respectively.

21. The method of claim 18, comprising equalizing the first and second gut nodes before amplifying the difference in voltages due to difference in voltages of the first digit line and a second digit line that is complementary to the first digit line.

* * * * *